(12) United States Patent
Bang et al.

(10) Patent No.: US 9,876,149 B2
(45) Date of Patent: Jan. 23, 2018

(54) SEMICONDUCTOR LIGHT EMITTING DEVICE PACKAGE AND LIGHT SOURCE MODULE USING SAME

(71) Applicant: SAMSUNG ELECTRONICS CO., LTD., Suwon-si (KR)

(72) Inventors: Jae Jun Bang, Hwaseong-si (KR); Young Kyung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/133,740

(22) Filed: Apr. 20, 2016

(65) Prior Publication Data

US 2017/0062666 A1 Mar. 2, 2017

(30) Foreign Application Priority Data

Aug. 28, 2015 (KR) .................. 10-2015-0121665

(51) Int. Cl.
*F21S 4/00* (2016.01)
*F21V 21/00* (2006.01)
*H01L 33/50* (2010.01)
*H01L 33/46* (2010.01)

(52) U.S. Cl.
CPC ............ *H01L 33/505* (2013.01); *H01L 33/46* (2013.01); *H01L 33/508* (2013.01)

(58) Field of Classification Search
CPC ...... H01L 33/505; H01L 33/46; H01L 33/508
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |

(Continued)

FOREIGN PATENT DOCUMENTS

| | | |
|---|---|---|
| JP | 3468018 B2 | 11/2003 |
| JP | 2008-103599 A | 5/2008 |

(Continued)

*Primary Examiner* — Donald Raleigh
(74) *Attorney, Agent, or Firm* — Sughrue Mion, PLLC

(57) ABSTRACT

A semiconductor light emitting device package may include: a light emitting diode (LED) chip having a first surface on which a first electrode and a second electrode are provided, a second surface opposite the first surface, and a plurality of side surfaces, a lateral wavelength conversion layer disposed on a side surface of the plurality of side surfaces of the LED chip, the lateral wavelength conversion layer comprising a wavelength conversion material, and a reflective layer covering the second surface of the LED chip, the reflective layer being configured to reflect light emitted by the LED chip back towards the LED chip.

20 Claims, 6 Drawing Sheets

(56) References Cited

U.S. PATENT DOCUMENTS

| | | | |
|---|---|---|---|
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,855,393 B2 | 12/2010 | Rösler et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,198,590 B2* | 6/2012 | Cox | G01N 21/3581 250/341.8 |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 8,785,957 B2 | 7/2014 | Hata et al. | |
| 2010/0252850 A1* | 10/2010 | Park | H01L 21/0237 257/98 |
| 2011/0284822 A1* | 11/2011 | Jung | H01L 33/505 257/13 |
| 2014/0001948 A1 | 1/2014 | Katayama et al. | |
| 2014/0186980 A1 | 7/2014 | Igarashi et al. | |
| 2014/0307447 A1 | 10/2014 | Ohta et al. | |
| 2015/0060917 A1* | 3/2015 | Vampola | H01L 33/504 257/98 |
| 2015/0069603 A1 | 3/2015 | Foong et al. | |
| 2015/0129907 A1 | 5/2015 | Iino | |

FOREIGN PATENT DOCUMENTS

| | | |
|---|---|---|
| JP | 2010-177375 A | 8/2010 |
| JP | 2014-179384 A | 9/2014 |
| JP | 5661552 B2 | 1/2015 |
| JP | 2015-070242 A | 4/2015 |
| KR | 10-2009-0001104 A | 1/2009 |
| KR | 10-2012-0001459 A | 1/2012 |
| KR | 10-2015-0018481 A | 2/2015 |

* cited by examiner

A-A'

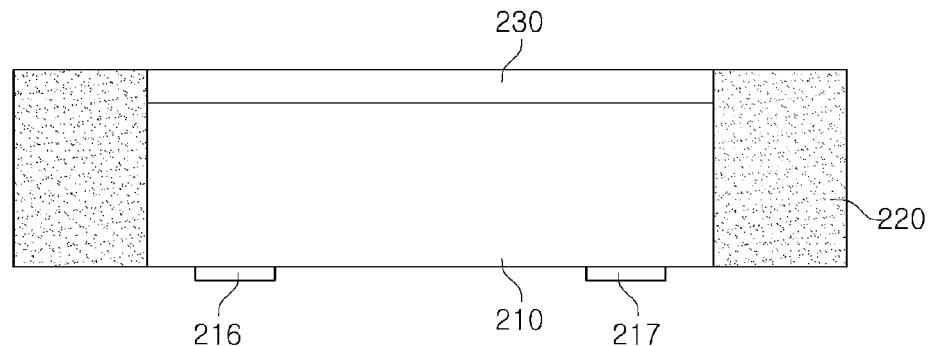
FIG. 7
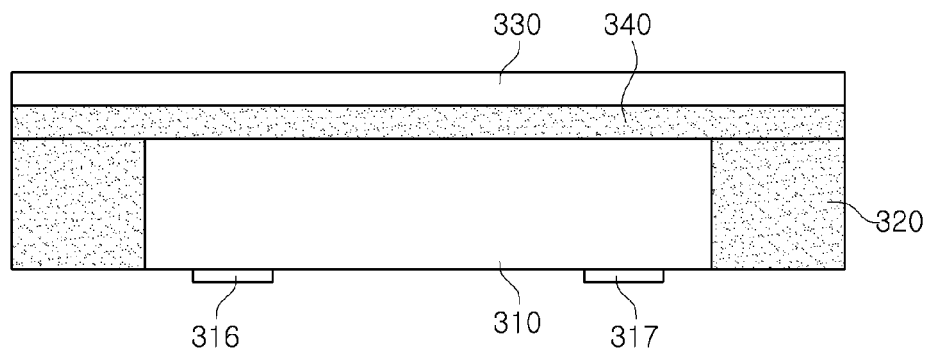
FIG. 8
FIG. 9

SEMICONDUCTOR LIGHT EMITTING DEVICE PACKAGE AND LIGHT SOURCE MODULE USING SAME

CROSS-REFERENCE TO RELATED APPLICATION

This application claims priority from Korean Patent Application No. 10-2015-0121665, filed on Aug. 28, 2015 in the Korean Intellectual Property Office, the disclosure of which is incorporated herein by reference in its entirety.

BACKGROUND

Apparatuses and methods consistent with example embodiments relate to a semiconductor light emitting device package and a light source module using the same.

When a current is applied to a semiconductor light emitting device, the semiconductor light emitting device emits light by combining electrons and holes. Semiconductor light emitting devices are widely used as light sources, and have low power consumption, high brightness, and small size. In particular, since nitride-based light emitting devices have been developed, use of semiconductor light emitting devices has expanded, and semiconductor light emitting devices have been employed in light source modules, home lighting fixtures, vehicle lighting, and the like.

With increased use of semiconductor light emitting device, the application of the semiconductor light emitting device has expanded to encompass high-current and high-output light source fields. As such, improvements in luminous efficiency have been studied. In particular, a method of increasing an orientation angle of light emitted from a package in which a semiconductor light emitting device is provided is needed.

SUMMARY

According to an aspect of an example embodiment, there is provided a semiconductor light emitting device package including: a light emitting diode (LED) chip having a first surface on which a first electrode and a second electrode are provided, a second surface opposite the first surface, and a plurality of side surfaces; a lateral wavelength conversion layer disposed on a side surface of the plurality of side surfaces of the LED chip, the lateral wavelength conversion layer including a wavelength conversion material; and a reflective layer covering the second surface of the LED chip, the reflective layer being configured to reflect light emitted by the LED chip back towards the LED chip.

The lateral wavelength conversion layer may have a uniform thickness.

The lateral wavelength conversion layer may surround each of the plurality side surfaces of the LED chip.

Opposite portions of the lateral wavelength conversion layer may have identical thicknesses.

The reflective layer may cover the second surface of the LED chip and an edge of the lateral wavelength conversion layer.

A side surface of the lateral wavelength conversion layer and a side surface of the reflective layer may be co-planar.

The reflective layer may include a material selected from the group consisting of $SiO_x$, $SiN_x$, $Al_2O_3$, HfO, $TiO_2$ and ZrO.

The reflective layer may be a flexible film.

The reflective layer may be a distributed Bragg reflector.

The reflective layer may be a metal thin film.

The LED chip may further include: a support substrate forming the second surface of the LED chip; and a light emitting structure including a first conductive semiconductor layer, an active layer, and a second conductive semiconductor layer sequentially disposed on the support substrate. The first electrode may be connected to the first conductive semiconductor layer and the second electrode may be connected to the second conductive semiconductor layer.

The reflective layer may have a uniform thickness.

According to an aspect of another example embodiment, there is provided a light source module including: a circuit board; and a plurality of semiconductor light emitting device packages mounted on a surface of the circuit board. Each of the semiconductor light emitting device packages includes: an LED chip having a first surface on which a first electrode and a second electrode are provided, a second surface opposite the first surface, and a plurality of side surfaces; a lateral wavelength conversion layer disposed on a side surface of the plurality of side surfaces of the LED chip, the lateral wavelength conversion layer having a uniform thickness, and including a wavelength conversion material; and a reflective layer covering the second surface of the LED chip, the reflective layer being configured to reflect light emitted by the LED chip back towards the LED chip.

Each of the LED chips may further include: a support substrate on the first surface of the LED chip; and a light emitting structure including a first conductive semiconductor layer, an active layer, and a second conductive semiconductor layer sequentially disposed on the support substrate. The first electrode may be connected to the first conductive semiconductor layer and the second electrode may be connected to the second conductive semiconductor layer.

The first and second electrodes may be mounted on the circuit board.

According to an aspect of yet another example embodiment, there is provided a light emitting device including: a first electrode; a second electrode; a first light emitting structure configured to emit light incident on a light emitting substrate, the first light emitting structure comprising a first conductive semiconductor layer electrically connected to the first electrode, a second conductive semiconductor layer electrically connected to the second electrode, and a first active semiconductor layer between the first conductive semiconductor layer and the second conductive semiconductor layer; a wavelength conversion layer disposed on the light emitting substrate; and a first reflective layer disposed on the wavelength conversion layer.

The light emitting device may further include a second reflective layer disposed between the first electrode and the second electrode, the second reflective layer being adjacent the first light emitting structure.

The light emitting substrate may include a repeating uneven structure disposed on a surface opposite to a surface facing the first light emitting structure.

The light emitting device may further include a buffer layer between the light emitting substrate and the first light emitting structure.

The light emitting device may further include a second light emitting structure configured to emit light incident on the light emitting substrate, the second light emitting structure comprising a third conductive semiconductor layer electrically connected to the first electrode, a fourth conductive semiconductor layer electrically connected to the second electrode, and a second active semiconductor layer between the third conductive semiconductor layer and the fourth conductive semiconductor layer; and an insulator disposed between the second conductive semiconductor layer, the third conductive semiconductor layer and the fourth conductive semiconductor layer.

BRIEF DESCRIPTION OF DRAWINGS

The above and other aspects, features, and advantages of the present disclosure will be more clearly understood from the following detailed description taken in conjunction with the accompanying drawings, in which:

FIG. 7 is a schematic cross-sectional view of a semiconductor light emitting device package according to an example embodiment;

FIG. 8 is a schematic cross-sectional view of a semiconductor light emitting device package according to an example embodiment;

FIGS. 9 through 12 are step-by-step views illustrating a process of manufacturing the semiconductor light emitting device package of FIG. 1, respectively;

DETAILED DESCRIPTION

Figure 1:
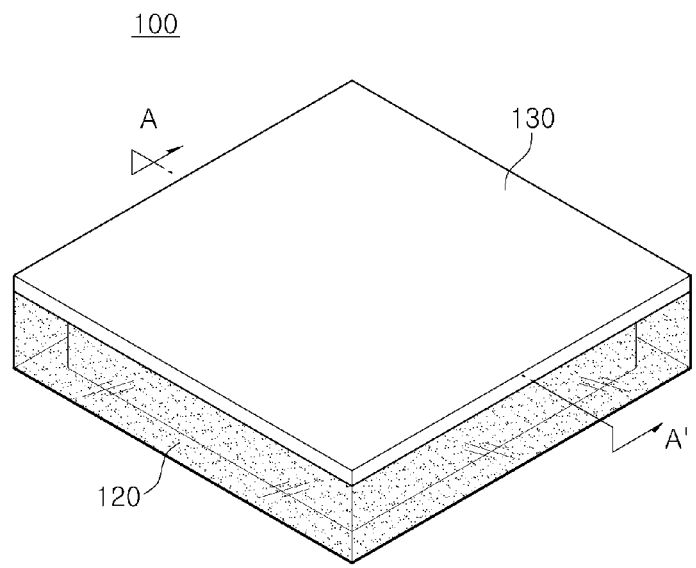
FIG. 1 is a schematic perspective view of a semiconductor light emitting device package according to an example embodiment.

Example embodiments will now be described more fully with reference to the accompanying drawings in which some example embodiments are shown. The present disclosure may, however, be embodied in different forms and should not be construed as limited to the example embodiments set forth herein. Rather, these example embodiments are provided so that this disclosure is thorough and complete and fully conveys the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when an example embodiment can be implemented differently, functions or operations described in a particular block may occur in a different way from a flow described in the flowchart. For example, two consecutive blocks may be performed simultaneously, or the blocks may be performed in reverse according to related functions or operations.

Figure 2:
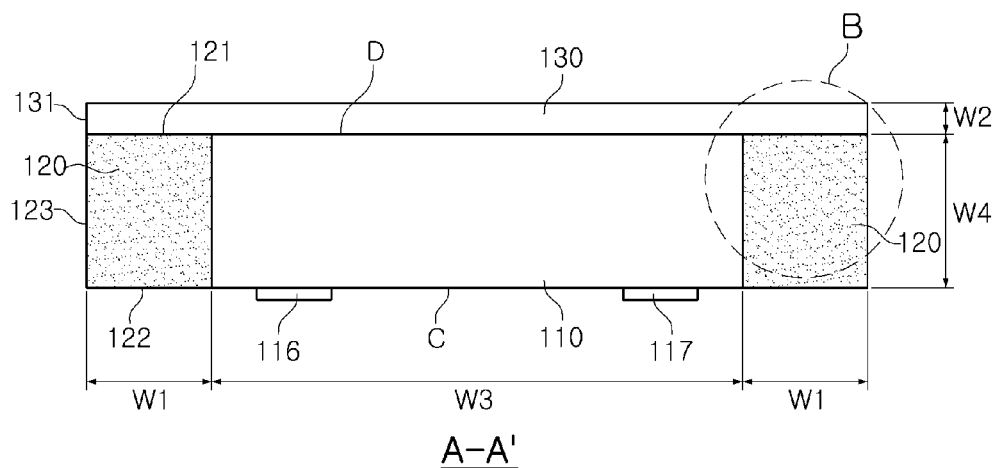
FIG. 2 is a schematic cross-sectional view taken along line A-A' of the semiconductor light emitting device package of FIG. 1.

FIG. 1 is a schematic perspective view of a semiconductor light emitting device package according to an example embodiment; FIG. 2 is a schematic cross-sectional view taken along line A-A' of the semiconductor light emitting device package of FIG. 1; and FIG. 3 is a schematic cross-sectional view illustrating a light emitting diode (LED) chip of FIG. 2.

Referring to FIGS. 1 and 2, a semiconductor light emitting device package 100 according to an example embodiment may include an LED chip 110 including a first electrode 116 and a second electrode 117, a lateral wavelength conversion layer 120 disposed on side surfaces of the LED chip 110, and a reflective layer 130 covering the LED chip 110.

Figure 3:
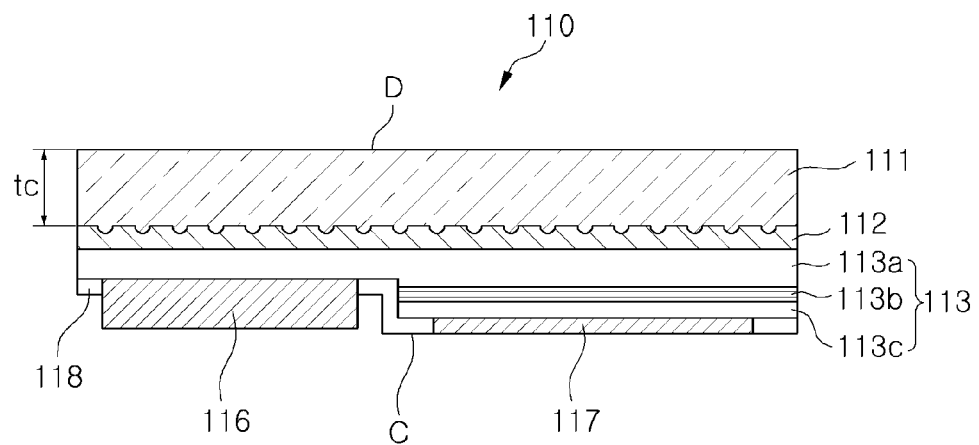
FIG. 3 is a schematic cross-sectional view illustrating a light emitting diode (LED) chip of FIG. 2.

Referring to FIG. 3, the LED chip 110 may have a first surface C on which the first and second electrodes 116 and 117 are disposed, and a second surface D opposite the first surface C.

The LED chip 110 may include a light transmitting substrate 111 and a light emitting structure 113 disposed on the light transmitting substrate 111. A surface of the light emitting structure 113 may form the first surface C, and the first and second electrodes 116 and 117 may be connected to the light emitting structure 113, respectively.

The light transmitting substrate 111 may be used with a substrate for semiconductor growth including materials such as sapphire, SiC, $MgAl_2O_4$, MgO, $LiAlO_2$, $LiGaO_2$, and GaN. In this case, the sapphire may be a crystal having Hexa-Rhombo R3c symmetry, have a lattice constant of 13.00 Å in a c-axis orientation, and a lattice constant of 4.758 Å in an a-axis orientation, and have a C-plane (0001), an A-plane (11-20), an R-plane (1-102), and the like. Here, the C-plane of this sapphire substrate may allow a thin nitride film to be grown thereupon relatively easily, and may be stable even at high temperatures.

The light transmitting substrate 111 may have surfaces opposite each other, and at least one of the surfaces may have an uneven structure formed thereon. The uneven structure may be provided by etching a portion of the light transmitting substrate 111, and may also be provided by forming a heterogeneous substance layer different from the light transmitting substrate 111.

As illustrated in FIG. 3, when an uneven structure is formed on a surface provided as a growth surface of the light emitting structure 113, stress due to a difference between crystal lattice constants at an interface between the light transmitting substrate 111 and a first conductive semiconductor layer 113a may be reduced. In more detail, when a group III nitride-based compound semiconductor layer is grown on the sapphire substrate, a difference between lattice constants of the sapphire substrate and the group III nitride-based compound semiconductor layer may cause dislocation defects. Such dislocation defects may spread upward and lower the crystal quality of the group III nitride-based compound semiconductor layer.

In the example embodiment, provision of an uneven structure having a convex portion on the light transmitting substrate 111 may allow the first conductive semiconductor layer 113a to be grown on a side surface of the convex portion, thereby preventing dislocation defects from spreading upwardly. Hence, a high-quality LED package with increased internal quantum efficiency may be provided.

Because the uneven structure may cause a path of light emitted from an active layer 113b to vary, a rate at which light is absorbed into the first and second conductive semiconductor layers 113a and 113c may be reduced and a light scattering rate may be increased, and thus light extraction efficiency may be improved.

Here, the light transmitting substrate 111 may have a thickness tc less than or equal to 100 μm. Although not limited thereto, the light transmitting substrate 111 may have a thickness of 1 to 20 μm. Such a thickness range may be obtained by grinding a growth substrate provided for semiconductor growth. In more detail, a polishing process, such as grinding the second surface D, or lapping the second surface D using lapping powder such that the second surface D may be ground down by abrasion and polishing, may be applied.

A buffer layer 112 may be disposed between the light transmitting substrate 111 and the light emitting structure 113. When the light emitting structure 113 is grown on the light transmitting substrate 111, for example, in the case that a thin GaN film is grown as a light emitting structure on a heterogeneous substrate, a mismatch between lattice constants of the heterogeneous substrate and the thin GaN film may cause lattice defects, such as dislocations, and warpage of the heterogeneous substrate caused by a difference between thermal expansion coefficients of the heterogeneous substrate and the thin GaN film may cause cracking of the light emitting structure 113. In order to control the defects, such as warpage, the buffer layer 112 may be formed on the light transmitting substrate 111, and then a light emitting structure having a required structure, for example, a nitride semiconductor, may be grown on the buffer layer 112. The buffer layer 112 may be a low-temperature buffer layer formed at a temperature lower than a single-crystal growth temperature at which the light emitting structure 113 is formed, however the temperature is not limited thereto.

A material forming the buffer layer 112 may be used with $Al_xIn_yGa_{1-x-y}N$ (0≤x≤1, 0≤y≤1), in particular, GaN, AlN, and AlGaN. For example, the buffer layer 112 may be an undoped GaN layer undoped with impurities and having a predetermined thickness.

Other materials, such as $ZrB_2$, $HfB_2$, ZrN, HfN, TiN, or ZnO, may be used as the material forming the buffer layer 112. A layer in which a plurality of layers are combined with each other, and of which a composition is gradually changed may also be used as the material forming the buffer layer 112.

The light emitting structure 113 may include the first conductive semiconductor layer 113a, the active layer 113b, and a second conductive semiconductor layer 113c sequentially disposed on a surface of the light transmitting substrate 111. The first and second conductive semiconductor layers 113a and 113c may be n- and p-type semiconductor layers, respectively, and may include a nitride semiconductor. Hence, the first and second conductive semiconductor layers 113a and 113c are not limited thereto, but in the example embodiment, it may be understood that the first and second conductive semiconductor layers 113a and 113c refer to n- and p-type nitride semiconductor layers, respectively. The first and second conductive semiconductor layers 113a and 113c may have a composition of $Al_xIn_yGa_{1-x-y}N$ (0≤x≤1, 0≤y≤1, 0≤x+y≤1) which corresponds to a material, such as GaN, AlGaN, or InGaN.

The active layer 113b may emit visible light having a wavelength in a range of about 350 nm to 680 nm, and may be configured of an undoped nitride semiconductor layer having a single or multiple quantum well (MQW) structure. The active layer 113b may have, for example, an MQW structure, in which quantum barrier layers and quantum well layers having a composition in which $Al_xIn_yGa_{1-x-y}N$ (0≤x≤1, 0≤y≤1, 0≤x+y≤1) are alternately stacked, and may be used with a structure having a predetermined band gap. Such quantum wells may allow electrons and holes to be recombined with each other to emit light. In the case of the MQW structure, for example, an InGaN or GaN structure may be used. The first and second conductive semiconductor layers 113a and 113c, and the active layer 113b may be formed using a crystal growth process, such as metal organic chemical vapour deposition (MOCVD), molecular beam epitaxy (MBE), or hydride vapor phase epitaxy (HVPE).

The first and second electrodes 116 and 117 may be respectively electrically connected to external surfaces of the first and second conductive semiconductor layers 113a and 113c, and may contact the first and second conductive semiconductor layers 113a and 113c, respectively.

The first and second electrodes 116 and 117 may include a monolayer or a multilayer structure formed of the first and second conductive semiconductor layers 113a and 113c and a conductive material having low ohmic characteristics. The first and second electrodes 116 and 117 may be formed by depositing, for example, at least one of Au, Ag, Cu, Zn, Al, In, Ti, Si, Ge, Sn, Mg, Ta, Cr, W, Ru, Rh, Ir, Ni, Pd, Pt, TCO, or other suitable material, using sputtering or the like. The first and second electrodes 116 and 117 may be disposed in an identical direction on the first surface C that is an opposite side of the light transmitting substrate 111, based on the light emitting structure 113. Hence, the LED chip 110 may be disposed on a mounting surface in the form of a flip chip. In this case, light emitted from the active layer 113b may be emitted externally via the light transmitting substrate 111. In addition, according to an example embodiment, in order for light not reflected by the first and second electrodes 116 and 117 to be reflected, a lower reflective layer 118 may be disposed to cover an area except an area, in which the first and second electrodes 116 and 117 are disposed, on the first surface C of the LED chip 110.

Figure 6:
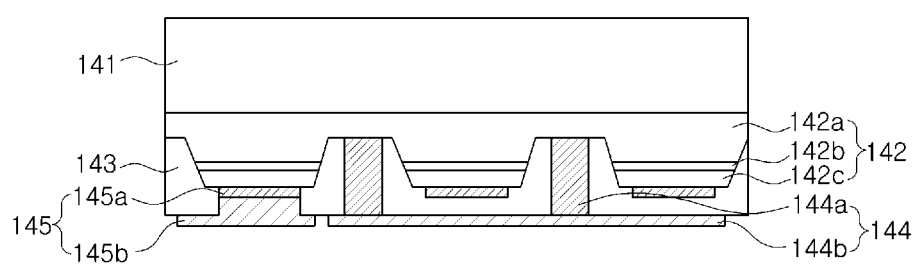
FIG. 6 is an example of the LED chip employed in the semiconductor light emitting device of FIG. 1.

FIG. 6 is an example of an LED chip employable in an example embodiment.

Referring to FIG. 6, an LED chip 140 may include a substrate 141, a first conductive semiconductor layer 142a on the substrate 141, an active layer 142b, and a second conductive semiconductor layer 142c. The LED chip 140 may further include a first electrode 144 and a second electrode 145 respectively connected to the first conductive semiconductor layer 142a and the second conductive semiconductor layer 142c.

The substrate 141 may be a light transmitting substrate as sapphire. The first conductive semiconductor layer 142a, the active layer 142b, and the second conductive semiconductor layer 142c may be stacked on the substrate 141, as a light emitting structure 142. Hereinafter, repeated descriptions of components referred to in the description of the LED chip of FIG. 3 will be omitted.

The first electrode 144 may include connecting electrode portions 144a having a conductive via shape, and passing through the second conductive semiconductor layer 142c and the active layer 142b to connect to the first conductive semiconductor layer 142a, and a first electrode pad 144b connected to the connecting electrode portions 144a. The connecting electrode portions 144a may be respectively surrounded by insulating portions 143 to be electrically isolated from the active layer 142b and the second conductive semiconductor layer 142c. The connecting electrode portions 144a may be modified in terms of number, shape, pitch or contact area with the first conductive semiconductor layer 142a, such that contact resistance may be reduced. The second electrode 145 may include an ohmic contact layer 145a on the second conductive semiconductor layer 142c and a second electrode pad 145b.

The connecting electrode portions 144a and the ohmic contact layer 145a may have a monolayer or a multilayer structure formed of the first and second conductive semiconductor layers 142a and 142c and a conductive material having low ohmic characteristics. For example, the connecting electrode portions 144a and the ohmic contact layer 145a may include at least one of materials, such as Ag, Al, Ni, Cr, and TCO.

The first and second electrode pads 144b and 145b may be connected to the connecting electrode portions 144a and the ohmic contact layer 145a, respectively, to function as external terminals of the LED chip 140. For example, the first and second electrode pads 144b and 145b may contain Au, Ag, Al, Ti, W, Cu, Sn, Ni, Pt, Cr, NiSn, TiW, AuSn or eutectic metals thereof. The first and second electrodes 144 and 145 may be disposed adjacent to each other in an identical direction, and may be mounted on a lead frame or the like in the form of a flip chip.

The first and second electrodes 144 and 145 may be electrically isolated from each other by the insulating portions 143. The insulating portions 143 may include a material having low light absorption. For example, the insulating portions 143 may be used with a silicon oxide or a silicon nitride, such as $SiO_2$, $SiO_xN_y$, or $Si_xN_y$. In an example embodiment, the insulating portions 143 may have a light-reflective structure in which a light-reflective filler is dispersed into a light transmitting material. Alternatively, the insulating portions 143 may have a multilayer reflective structure in which a plurality of insulating layers having different respective refractive indexes are alternately stacked.

As illustrated in FIG. 2, the lateral wavelength conversion layer 120 may be disposed to cover the side surfaces of the LED chip 110. The lateral wavelength conversion layer 120 may be disposed to surround all of the side surfaces of the LED chip 110. However, the lateral wavelength conversion layer 120 is not limited thereto, and may be partially disposed on a side surface of the LED chip 110.

The lateral wavelength conversion layer 120 may be disposed on the side surfaces of the LED chip 110 and have a substantially uniform thickness W1. Here, the substantially uniform thickness may mean that a change in the thickness of the lateral wavelength conversion layer 120 is within an acceptable error range in a process of manufacturing the semiconductor light emitting device package, even though the thickness does not remain completely constant along the side surfaces of the LED chip 110.

When the lateral wavelength conversion layer 120 each side surface of the LED chip 110, the lateral wavelength conversion layer 120 surrounding the respective surfaces of the LED chip 110 may be disposed to have the substantially uniform thickness W1. The lateral wavelength conversion layer 120 is not limited thereto, and may be disposed to have a substantially uniform thickness on opposite side surfaces of the LED chip 110. Here, the lateral wavelength conversion layer 120 may be configured to have the thickness W1 and a height W4.

An upper surface 121 of the lateral wavelength conversion layer 120 contact an edge of the reflective layer 130. Here, side surfaces 123 of the lateral wavelength conversion layer 120 and side surfaces 131 of the reflective layer 130 may form co-planar surfaces, respectively. A lower surface 122 of the lateral wavelength conversion layer 120 may also have a curved surface having a meniscus shape.

The lateral wavelength conversion layer 120 may have a light transmitting material is mixed with a wavelength conversion material. In the example embodiment, such a light transmitting material may include a thermosetting resin. For example, the lateral wavelength conversion layer 120 may be a composite material in which a polymer binder including a thermosetting resin, a hardener, a curing catalyst, and the like is semi-cured (B-stage). Such a thermosetting resin may remain in a semi-cured state when heated at a temperature below a predetermined threshold temperature to undergo a phase change to a level at which the thermosetting resin is malleable, but may be cured when heated at a temperature greater than or equal to a predetermined level. Hence, a wavelength conversion material may be coated on the side surfaces of the LED chip 110 in a dispersed, semi-cured state, and may then be cured through a heating process to cover the side surfaces of the LED chip 110.

A resin used in the lateral wavelength conversion layer 120 may be used with an epoxy resin or a silicone resin that may satisfy properties, such as high levels of adhesion, high light transmittance, high heat resistance, a high refractive index, and good moisture resistance. In order to secure a high level of adhesion, an additive, for example a silane-based material, may be employed.

The wavelength conversion material may be used with a phosphor or a quantum dot. The phosphor may be used with a garnet-based phosphor, such as YAG, TAG, or LuAG, a silicate-based phosphor, a nitride-based phosphor, a sulfide-based phosphor or an oxide-based phosphor, and may be configured as a single type of phosphor or multiple types of phosphors mixed at a predetermined ratio.

The lateral wavelength conversion layer 120 may have a structure in which a monolayer is stacked, or may be formed as a multilayer structure. When the lateral wavelength conversion layer 120 is formed as a multilayer structure, each of the multiple layers may contain different types of light transmitting materials and wavelength conversion materials. Here, light transmitting materials forming the respective layers may have different characteristics, respectively.

For example, light transmitting materials forming a lower layer may have characteristics in which the strength of the light transmitting materials is higher than that of light transmitting materials forming an upper layer, so that the lateral wavelength conversion layer 120 may maintain a stable shape. Light transmitting materials forming a layer that contacts the reflective layer 130 may also have a characteristic in which the light transmitting materials have a level of adhesion higher than that of the light transmitting materials forming the lower layer, so that the lateral wavelength conversion layer 120 may be easily bonded to the reflective layer 130. One of the plurality of layers may include a transparent layer not containing a wavelength conversion material.

The lateral wavelength conversion layer 120 disposed with such a configuration may convert a wavelength of light emitted from the side surfaces of the LED chip 110. This will be described later.

As illustrated in FIG. 2, the reflective layer 130 may cover the entire second surface D of the LED chip 110.

The reflective layer 130 may be formed in a state in which a material containing at least one of $SiO_2$, SiN, $SiO_xN_y$, $TiO_2$, $Si_3N_4$, $Al_2O_3$, TiN, AlN, $ZrO_2$, TiAlN and TiSiN having excellent reflectivity is dispersed in a material similar to the light transmitting material used in the lateral wavelength conversion layer 120 described above. The light transmitting material may contain the thermosetting resin described above. Hence, the reflective layer 130 may remain semi-cured when heated at a temperature lower than a predetermined threshold temperature to undergo a phase change to a level at which the thermosetting resin is movable, but may be cured when heated at a temperature greater than or equal to a predetermined level. The reflective layer 130 may be provided in the form of a sheet having adhesiveness and being semi-cured. The LED chip 110 may be attached to the reflective layer 130, and then may be cured through a heating process, so that the reflective layer 130 may firmly adhere to an upper surface of the LED chip 110. In an example embodiment, the reflective layer 130 may be used with a material in which $TiO_2$ and silicone resin are mixed with each other at a ratio of 1:1. The reflective layer 130 may be configured of a monolayer or a multilayer film structure, and may be configured of a metal thin film or a distributed Bragg reflector, having high reflectivity.

As illustrated in FIG. 2, the reflective layer 130 may be disposed to have a width W3 to cover the LED chip 110, or to have a width W1+W3+W1 to cover the upper surface 121 of the lateral wavelength conversion layer 120.

Figure 4:
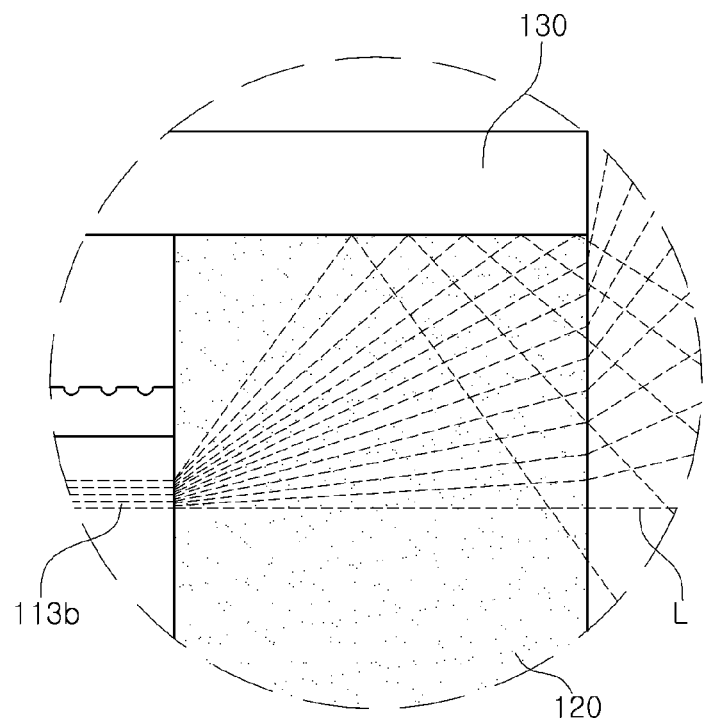
FIG. 4 is an enlarged view of B of FIG. 2.

As illustrated in FIG. 4, the reflective layer 130 may reflect light such that an optical path L of light emitted from the active layer 113b may be redirected towards the lateral wavelength conversion layer 120. Hence, the semiconductor light emitting device package 100 according to an example embodiment may increase an orientation angle of light emitted to the side surfaces thereof. This will be described in more detail hereinafter.

A semiconductor light emitting device package in which reflective layers are disposed on side surfaces and a lower surface of an LED chip, respectively, may allow light emitted towards the side surfaces or the lower surface of the LED chip to be redirected towards an upper surface of the LED chip. As such, because light emitted from the side surfaces of the LED chip is reflected, light emitted from the semiconductor light emitting device package should be radiated forwardly therefrom at an orientation angle of 120 to 150 degrees. Hence, the semiconductor light emitting device package in which such a flip chip-type LED chip is provided may not emit light at a wide orientation angle of 180 degrees without an optical system, such as a diffusion lens.

In the example embodiment, the reflective layer 130 may be disposed on an upper portion of the LED chip 110 so that light concentrated on an upper portion of the semiconductor light emitting device package 100 may be reflected to side surfaces thereof. The lateral wavelength conversion layer 120 may be disposed on the side surfaces of the LED chip, and thus light reflected to the side surfaces of the LED chip 110 may be converted to light having a required wavelength, and may then be emitted from the semiconductor light emitting device package 100. As such, light may be emitted to the side surfaces of the semiconductor light emitting device package 100, and light having an orientation angle of 180 degrees may be provided without an optical system. Resultantly, manufacturing costs may be reduced, and a thickness of the semiconductor light emitting device package 100 may be reduced, and thus, a space required for mounting the semiconductor light emitting device package 100 may be reduced.

Figure 5:
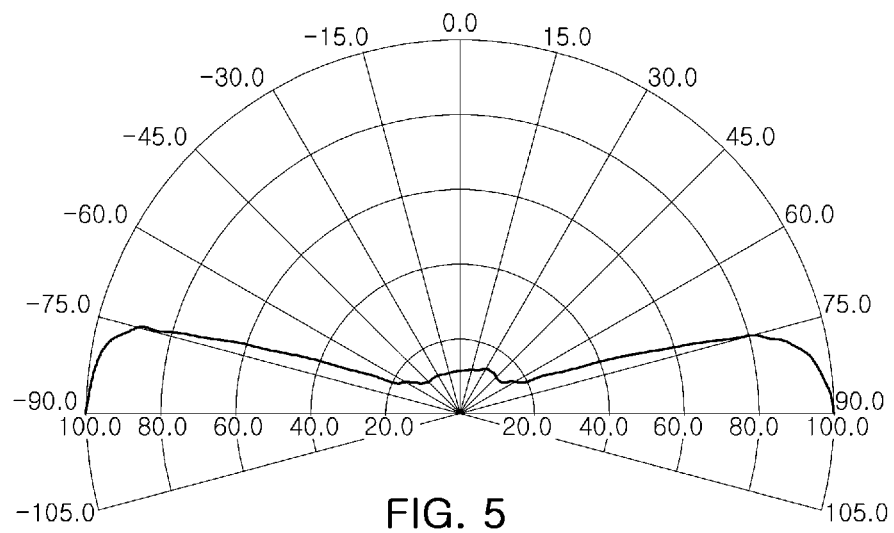
FIG. 5 is a diagram illustrating light distribution.

FIG. 5 is a diagram illustrating light distribution depending on angles of light emitted from a semiconductor light emitting device package according to an example embodiment. It can be seen that an orientation angle of light is in a range of −90 to 90 degrees, and particularly, light having an orientation angle in a range of 75 to 90 degrees and that in a range of −75 to −90 degrees is increased.

Next, a semiconductor light emitting device package 200 according to an example embodiment will be described. FIG. 7 is a schematic cross-sectional view of a semiconductor light emitting device package according to an example embodiment. Hereinafter, repeated descriptions of components in the description of FIG. 2 will be omitted.

Referring to FIG. 7, the semiconductor light emitting device package 200 according to the example embodiment may include an LED chip 210 including a first electrode 216 and a second electrode 217, a lateral wavelength conversion layer 220 covering side surfaces of the LED chip 210 and a reflective layer 230, and the reflective layer 230 may cover an upper surface of the LED chip 210. As compared to an example embodiment described above, the present example embodiment may differ therefrom in that the reflective layer 230 may only be disposed on the upper surface of the LED chip 210, and may not be disposed on an upper surface of the lateral wavelength conversion layer 220. Hence, light may be emitted through the upper surface of the lateral wavelength conversion layer 220.

Next, a semiconductor light emitting device package 300 according to an example embodiment will be described. FIG. 8 is a schematic cross-sectional view of a semiconductor light emitting device package according to an example embodiment. Hereinafter, repeated descriptions of components referred to using the same names as those in the description of FIG. 2 will be omitted.

Referring to FIG. 8, the semiconductor light emitting device package 300 according to the example embodiment may include an LED chip 310 including a first electrode 316 and a second electrode 317, a lateral wavelength conversion layer 320 covering side surfaces of the LED chip 310, a reflective layer 330 covering an upper wavelength conversion layer 340, and the upper wavelength conversion layer 340 may cover an upper surface of the LED chip 310. As compared to an example embodiment described above, the present example embodiment may differ therefrom in that the reflective layer 330 and the LED chip 310 may have the upper wavelength conversion layer 340 disposed therebetween. Hence, even when a small amount of light is emitted through the reflective layer 330, as reflectivity of the reflective layer 330 may not reach 100%, emission of light of which a wavelength is not converted may be prevented. Resultantly, color uniformity of the semiconductor light emitting device package 300 may be maintained.

Next, a process of manufacturing a semiconductor light emitting device package will be described. FIGS. 9 through 12 are step-by-step views illustrating a process of manufacturing the semiconductor light emitting device package of FIG. 1, respectively.

First, as illustrated in FIG. 9, a reflective sheet 130a may be prepared. The reflective sheet 130a may include a mixture of a light transmitting material and light reflecting particles, such as $SiO_2$, SiN, $SiO_xN_y$, $TiO_2$, $Si_3N_4$, $Al_2O_3$, TiN, AlN, $ZrO_2$, TiAlN and TiSiN, and may be provided in a flexible semi-cured state. Such a light transmitting material may be used with an epoxy resin or a silicone resin. In an example embodiment, the light transmitting material may be used with a material in which $TiO_2$ and silicone mixed at a ratio of 1:1.

The reflective sheet 130a may be provided in a semi-cured adhesive state by being heated at a temperature lower than a curing temperature after mixing light reflecting particles with a light transmitting material. Hence, the reflective sheet 130a may be used in attaching and aligning the LED chips 110 in a follow-up process.

Figure 10:
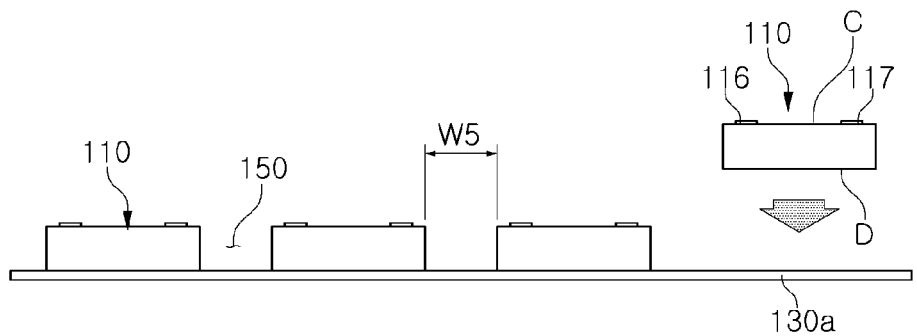

Next, as illustrated in FIG. 10, a plurality of prepared LED chips 110 may be arranged on a surface of the reflective sheet 130a. The second surfaces D of the LED chips 110 may be attached to the reflective sheet 130a such that the first surface C, on which the first and second electrodes 116 and 117 are disposed, is exposed. A chip separation region 150 between the plurality of LED chips 110 may allow a width W5 of the chip separation region 150 to be adjusted with consideration of a space in which a lateral wavelength conversion layer is to be formed, and of a region, which will be lost in a process of cutting an individual semiconductor light emitting device package.

After the LED chips 110 are attached to the reflective sheet 130a, the reflective sheet 130a may be heated at a temperature greater than or equal to a curing temperature, being cured. In an example embodiment, the reflective sheet 130a remains heated for about 30 minutes at a temperature of about 150° C., being cured.

Figure 11:
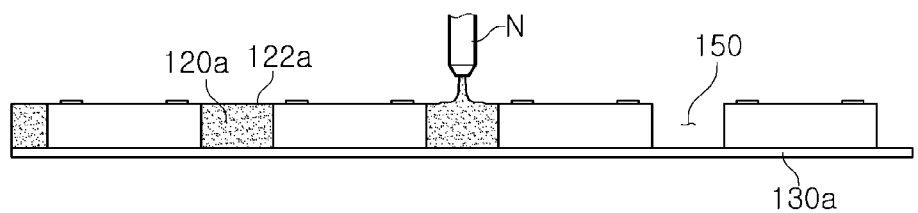

Next, as illustrated in FIG. 11, the chip separation region 150 between the plurality of LED chips 110 may be coated with a wavelength conversion material so that a wavelength conversion layer 120a may be formed. As described above, the wavelength conversion material may be coated while being dispersed in a liquid light transmitting material. In more detail, the wavelength conversion material may be dispensed using a nozzle N. The method of forming the wavelength conversion layer 120a is not limited thereto, and the wavelength conversion layer 120a may be formed using another method, such as screen printing. When the wavelength conversion layer 120a is formed by dispersing a wavelength conversion material in a liquid light transmitting material and then dispensing the wavelength conversion material, due to surface tension, meniscuses may be formed on a surface 122a of the wavelength conversion layer 120a.

After the wavelength conversion material is coated, the wavelength conversion material may be heated at a temperature greater than or equal to a curing temperature for the light transmitting material, being cured, and thus the wavelength conversion layer 120a may be formed. In an example embodiment, the liquid light transmitting material remains heated for about 30 minutes at a temperature of about 150° C., forming the wavelength conversion layer 120a.

Figure 12:
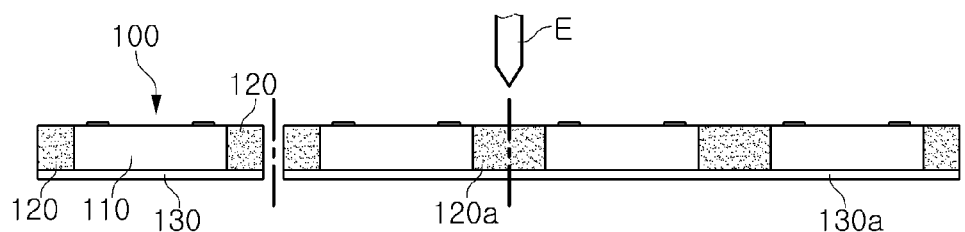

Next, as illustrated in FIG. 12, a blade E may cut the reflective sheet 130a and the wavelength conversion layer 120a into individual semiconductor light emitting device packages 100. Here, the wavelength conversion layer 120a may be cut in half so that lateral wavelength conversion layers 120 having identical thicknesses may be disposed on the side surfaces of the semiconductor light emitting device package 100, respectively. A method of separating individual semiconductor light emitting device packages 100 is not limited thereto, and may be separated using laser beams or water jets.

Figure 13:
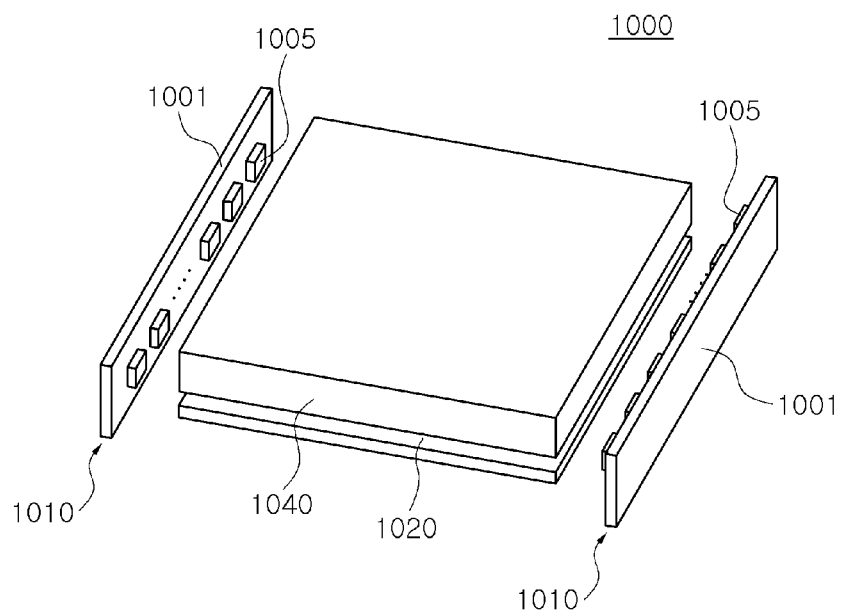
FIG. 13 is a schematic perspective view of a light source module according to an example embodiment.

FIG. 13 is a schematic perspective view of a light source module according to an example embodiment.

Referring to FIG. 13, a light source module 1000 may include a light guide plate 1040, and light source modules 1010 provided on opposite side surfaces thereof. The light source module 1000 may also further include a reflective plate 1020 disposed on a lower portion of the light guide plate 1040. The light source module 1000 of the example embodiment may be an edge-type backlight unit module.

According to an example embodiment, the light guide plate 1040 may be provided on a side surface of each of the light source modules 1010, or additionally on other side surfaces thereof. The light source module 1010 may include a printed circuit board (PCB) 1001 and a plurality of light emitting devices 1005 mounted on an upper surface of the PCB 1001, and each of the light emitting devices 1005 may include the semiconductor light emitting device package 100 of FIG. 1.

Figure 14:
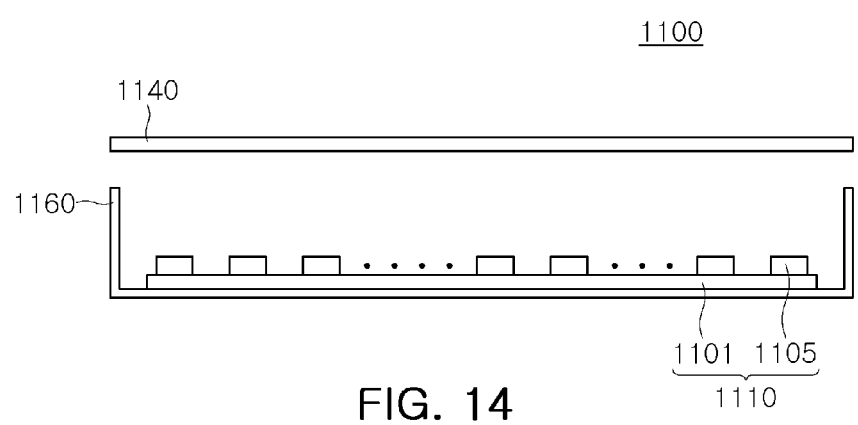
FIG. 14 is a schematic cross-sectional view of a light source module according to an example embodiment.

FIG. 14 is a schematic cross-sectional view of a light source module according to an example embodiment.

Referring to FIG. 14, a light source module 1100 may include a light diffusion plate 1140, and a light source module 1110 disposed below the light diffusion plate 1140. The light source module 1100 may also further include a bottom case 1160 disposed below the light diffusion plate 1140, and accommodating the light source module 1110. The light source module 1100 of the example embodiment may be a direct-type backlight unit module.

The light source module 1110 may include a PCB 1101 and a plurality of light emitting devices 1105 mounted on an upper surface of the PCB 1101, and the light emitting devices 1105 may include the semiconductor light emitting device package 100 of FIG. 1. A reflective sheet may be attached to the upper surface of the PCB 1101.

As set forth above, according to example embodiments, a lateral wavelength conversion layer may be disposed the side surfaces of an LED chip, and a reflective layer may be arranged on an upper surface of the LED chip. Thus, the semiconductor light emitting device package having an increased orientation angle of light and the light source module using the same may be provided.

While example embodiments have been shown and described above, it will be apparent to those skilled in the art that modifications and variations could be made without departing from the scope of the present disclosure as defined by the appended claims.

What is claimed is:

1. A semiconductor light emitting device package comprising:
   a light emitting diode (LED) chip having a first surface on which a first electrode and a second electrode are provided, a second surface opposite to the first surface, and a plurality of side surfaces;
   a lateral wavelength conversion layer disposed on a side surface of the plurality of side surfaces of the LED chip, the lateral wavelength conversion layer comprising a wavelength conversion material; and
   a reflective layer covering the second surface of the LED chip, and a surface of the lateral wavelength conversion layer which is substantially coplanar with the second surface of the LED chip, the reflective layer being configured to reflect light emitted by the LED chip back towards the LED chip.

2. The semiconductor light emitting device package of claim 1, wherein the lateral wavelength conversion layer has a uniform thickness.

3. The semiconductor light emitting device package of claim 1, wherein the lateral wavelength conversion layer surrounds each of the plurality of side surfaces of the LED chip.

4. The semiconductor light emitting device package of claim 3, wherein opposite portions of the lateral wavelength conversion layer have identical thicknesses.

5. The semiconductor light emitting device package of claim 1, wherein the reflective layer covers the second surface of the LED chip and an edge of the lateral wavelength conversion layer.

6. The semiconductor light emitting device package of claim 5, wherein a side surface of the lateral wavelength conversion layer and a side surface of the reflective layer are co-planar.

7. The semiconductor light emitting device package of claim 1, wherein the reflective layer comprises a material selected from among $SiO_x$, $SiN_x$, $Al_2O_3$, $HfO$, $TiO_2$ and $ZrO$.

8. The semiconductor light emitting device package of claim 1, wherein the reflective layer is a flexible film.

9. The semiconductor light emitting device package of claim 1, wherein the reflective layer is a distributed Bragg reflector.

10. The semiconductor light emitting device package of claim 1, wherein the reflective layer is a metal thin film.

11. The semiconductor light emitting device package of claim 1, the LED chip further comprising:
    a support substrate forming the second surface of the LED chip; and
    a light emitting structure comprising a first conductive semiconductor layer, an active layer, and a second conductive semiconductor layer sequentially disposed on the support substrate,
    wherein the first electrode is connected to the first conductive semiconductor layer and the second electrode is connected to the second conductive semiconductor layer.

12. The semiconductor light emitting device package of claim 1, wherein the reflective layer has a uniform thickness.

13. A light source module comprising:
    a circuit board; and
    a plurality of semiconductor light emitting device packages mounted on a surface of the circuit board,
    wherein each of the plurality of semiconductor light emitting device packages comprises:
       an LED chip having a first surface on which a first electrode and a second electrode are provided, a second surface opposite to the first surface, and a plurality of side surfaces;
       a lateral wavelength conversion layer disposed on a side surface of the plurality of side surfaces of the LED chip, the lateral wavelength conversion layer having a uniform thickness, and comprising a wavelength conversion material; and
       a reflective layer covering the second surface of the LED chip and a surface of the lateral wavelength conversion layer which is substantially coplanar with the second surface of the LED chip, the reflective layer being configured to reflect light emitted by the LED chip back towards the LED chip.

14. The light source module of claim 13, wherein the LED chip of each of the plurality of semiconductor light emitting device packages further comprises:
    a support substrate on the first surface of the LED chip; and
    a light emitting structure comprising a first conductive semiconductor layer, an active layer, and a second conductive semiconductor layer sequentially disposed on the support substrate,
    wherein the first electrode is connected to the first conductive semiconductor layer and the second electrode is connected to the second conductive semiconductor layer.

15. The light source module of claim 14, wherein each of the first electrode and the second electrode are mounted on the circuit board.

16. A light emitting device comprising:
    a first electrode;
    a second electrode;
    a first light emitting structure configured to emit light incident on a light emitting substrate, the first light emitting structure comprising a first conductive semiconductor layer electrically connected to the first electrode, a second conductive semiconductor layer electrically connected to the second electrode, and a first active semiconductor layer between the first conductive semiconductor layer and the second conductive semiconductor layer;
    a wavelength conversion layer disposed on the light emitting substrate; and
    a first reflective layer disposed on the wavelength conversion layer,
    wherein the first electrode and the second electrode are disposed on a first surface of the first light emitting structure, and
    wherein the wavelength conversion layer and the first reflective layer are disposed on a second surface of the first light emitting structure opposite to the first surface.

17. The light emitting device of claim 16, further comprising a second reflective layer disposed between the first electrode and the second electrode, the second reflective layer being adjacent the first light emitting structure.

18. The light emitting device of claim 16, wherein the light emitting substrate comprises a repeating uneven structure disposed on a surface opposite to a surface facing the first light emitting structure.

19. The light emitting device of claim 16, further comprising a buffer layer between the light emitting substrate and the first light emitting structure.

20. The light emitting device of claim 16, further comprising a second light emitting structure configured to emit light incident on the light emitting substrate, the second light emitting structure comprising a third conductive semiconductor layer electrically connected to the first electrode, a fourth conductive semiconductor layer electrically connected to the second electrode, and a second active semiconductor layer between the third conductive semiconductor layer and the fourth conductive semiconductor layer; and an insulator disposed between the second conductive semiconductor layer, the third conductive semiconductor layer and the fourth conductive semiconductor layer.

* * * * *